Figure 1:
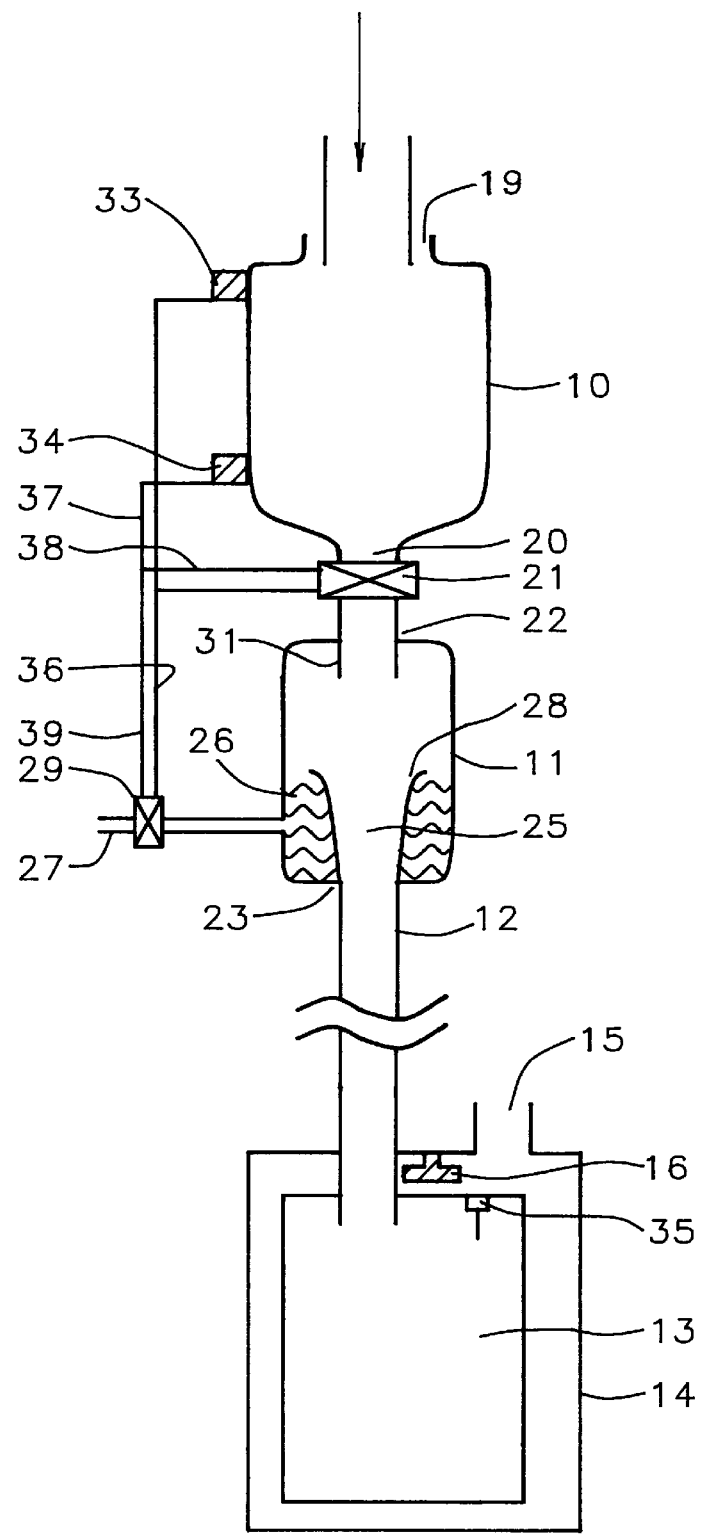

United States Patent [19]
Chiang et al.

[11] Patent Number: 5,954,078
[45] Date of Patent: Sep. 21, 1999

[54] METHOD AND APPARATUS FOR HANDLING LIQUID CHEMICAL WASTE

[75] Inventors: Lien-Hsiang Chiang, Taichang; Ying-Hsiang Chen, Hsin-Chu, both of Taiwan

[73] Assignee: Taiwan Semiconductor Manufacturing Company, Ltd., Hsin-Chu, Taiwan

[21] Appl. No.: 08/822,246

[22] Filed: Mar. 20, 1997

[51] Int. Cl.[6] .......................... F16K 21/00; F16K 31/02; B05C 7/00
[52] U.S. Cl. ............................ 137/2; 118/408; 118/429; 118/DIG. 10; 137/13; 137/392; 137/395; 137/396; 137/571; 137/572; 137/590.5; 141/198; 222/64
[58] Field of Search .............................. 137/392, 395, 137/396, 240, 590.5, 2, 571, 572, 13; 222/66, 64, 65; 148/198; 134/100.1; 118/408, 429, DIG. 10, 12, 13

[56] References Cited

U.S. PATENT DOCUMENTS

| | | |
|---|---|---|
| 2,612,180 | 9/1952 | Schwarzkopf ........................ 137/392 |
| 2,893,444 | 7/1959 | Waddington et al. ........... 118/DIG. 10 |
| 3,671,142 | 6/1972 | Calabrese ............................... 137/392 |
| 4,186,849 | 2/1980 | Spangler ................................ 137/392 |
| 4,244,385 | 1/1981 | Hotine .................................... 137/392 |
| 4,660,586 | 4/1987 | Knapp et al. .......................... 137/386 |
| 4,821,921 | 4/1989 | Cartwright et al. ...................... 222/65 |
| 5,207,251 | 5/1993 | Cooks .................................... 137/392 |
| 5,680,960 | 10/1997 | Keyes et al. ............................. 222/64 |

FOREIGN PATENT DOCUMENTS 404102600  3/1992  Japan ..................................... 137/392

*Primary Examiner*—George L. Walton
*Attorney, Agent, or Firm*—George O. Saile; Stephen B. Ackerman

[57] ABSTRACT

A buffer tank and pre-wetting apparatus prevent a liquid chemical waste from crystalizing on the inside walls of a drain pipe that carries the waste to a waste tank. The pre-wetting apparatus includes a pre-wetting tank with an overflow pipe that leads to the waste tank drain pipe. A water supply is connected to fill the pre-wetting tank to the rim of the overflow pipe and then overflow to wet the inside walls of the drain pipe before waste from the buffer tank is transferred through the overflow pipe and to the drain pipe and the waste tank.

11 Claims, 1 Drawing Sheet

METHOD AND APPARATUS FOR HANDLING LIQUID CHEMICAL WASTE

FIELD OF THE INVENTION

This invention relates generally to an apparatus and associated method for handling a liquid chemical waste. More specifically the invention relates to an apparatus and process for preventing a liquid waste from forming deposits on the apparatus piping.

INTRODUCTION

Manufacturing semiconductors is a familiar example of a process that produces chemical waste that must be processed to prevent injury to people running the process and damage to the environment. A specific example is SOG, a chemical used in manufacturing semiconductors.

Commonly, the waste chemical is put temporarily into a waste holding tank. When the tank has been filled, it is shipped to processors who dispose of the chemicals in a suitable way.

The waste tank has any suitable shape but it will simplify the description to suppose that each tank in the system is an upright cylinder with flat circular top and bottom surfaces. Similarly, it will be convenient to suppose that other tanks in the system are similarly shaped and that the pipes in the system are cylindrical, straight and vertical. Where a different shape is preferred, it will be described. The art of tanks and piping is well developed, and variations in the shapes of these components, and in some cases in their orientation, will be readily understood without specific explanation.

The waste tank is commonly of a size that can be easily handled by the shipper, for example about 55 gallons.

One of the problems with this apparatus is that the chemical crystalizes on a drain pipe that leads into the waste tank. One potential problem is that the deposited waste may block the flow of waste in the pipe.

SUMMARY OF THE INVENTION

The waste handling apparatus of this invention uses the removable waste tank and the associated drain pipe that have already been described.

One object of this invention is to provide a new and improved waste handling system that prevents the waste from depositing on the walls of the system. A more specific object of the invention is to prevent the waste from crystalizing on the walls of a pipe to a waste tank.

The invention provides a buffer tank that holds a predetermined amount of liquid waste before the waste is transferred through the drain pipe and into the waste tank. The buffer tank receives the liquid waste until a suitable amount has been collected (about ten liters) and then a valve located at the lower outlet of the buffer tank is opened to transfer the liquid to the waste tank.

The buffer tank introduces a high volume flow into the waste tank and thereby tends to prevent crystallization. By contrast, in the prior art system without the buffer tank the liquid tends to flow steadily at a low rate that promotes crystallization.

Note that this crystallization a problem in the drain pipe and not in the buffer tank or the relief valve. The drain pipe may be long enough for its length to cause the liquid to cool and thereby crystalize out. The drain pipe may be located where the crystalized solvent would be dangerous to people working nearby. As an additional distinction between the buffer tank and the waste pipe, the waste pipe is hard to replace when it becomes coated with the solvent. Crystallization in the relief valve is a only minor problem because the valve is easy to check for crystallization and is easy to replace.

A pre-wetting apparatus for the drain pipe connects the buffer tank lower outlet to the drain pipe. The pre-wetting apparatus includes a pre-wetting tank with an upper inlet from the buffer tank and a lower outlet connection to the drain pipe of the waste tank.

An overflow pipe extends for a predetermined distance into the pre-wetting tank. The overflow pipe is spaced from the inner walls of the tank to form a space for holding a liquid, preferably water. In the embodiment in which all of the tanks and pipes are cylindrical, the overflow pipe can be concentric with the pre-wetting tank.

A water supply pipe is connected to the side wall of the pre-wetting tank below the rim of the overflow pipe. Before the buffer tank outlet valve is opened to transfer waste from the buffer tank to the pre-wetting tank, this valve is opened to admit a predetermined amount of water into the pre-wetting tank. While the valve is open, water flows over the rim of the overflow pipe and flows down the inside wall of the pipe, wetting the pipe. When the relief valve is opened, the waste from the buffer tank flows along the pre-wetted drain pipe and is less likely to crystalize on the walls of the tank.

The buffer tank is given an upper level sensor and a lower level sensor. Signals from these sensors control the relief valve and the water-in valve to run the process automatically.

Another object of this invention is to reduce the amount of water that is used in handling the waste. A related object is to avoid unnecessarily diluting the water in the waste tank and to thereby reduce the number of times a waste tank must be shipped to the waste processor. The buffer tank permits the pre-wetting apparatus to be used only when enough waste has been accumulated to produce a substantial flow that helps to prevent crystallization.

The Drawing

FIG. 1 is a diagram of the apparatus of this invention.

THE PREFERRED EMBODIMENT

Introduction

As FIG. 1 shows, a liquid chemical waste enters the apparatus at the top of the drawing, flows through a buffer tank 10, a pre-wetting tank 11 and through a drain pipe 12 and into a waste tank 13.

In the preferred embodiment, the chemical waste is SOG from a machine in a semiconductor manufacturing line. The invention is useful with various kinds of waste producing processes, and this conventional apparatus is not shown. The piping connection between the waste producing apparatus and the apparatus of the drawing is conventional.

The waste tank 13 is conventional. Commonly, it is located inside a storage box 14. Box 14 commonly has an exhaust opening 15 and is provided with a fire extinguisher 16. These components represent a variety of structures found in these components of the waste handling system.

The Buffer Tank

Buffer tank 10 is connected to receive the chemical waste. Preferably, the waste enters an inlet 19 at the top of the buffer tank and flows out by gravity at an outlet 20 at the bottom of the buffer tank. Modifications to use differently shaped pipes or to use pumps instead of gravity flow will be understood without specific description.

A relief valve 21 (later called the first valve) is located at buffer tank outlet 20 to hold the liquid in the buffer tank when the relief valve is closed and to allow the liquid to flow out when the relief valve is open. Apparatus for operating the valve automatically will be described later.

The Pre-wetting Apparatus

Pre-wetting tank 11 has an upper inlet 22 connected to receive waste from relief valve 21 and a lower outlet 23. An overflow pipe 25 extends from lower outlet 23 upward for a predetermined distance. The overflow pipe is spaced from the inner walls of pre-wetting tank 11 to form a space 26 for holding a pre-wetting liquid, preferably water. In the embodiment in which all of the tanks and pipes are cylindrical, overflow pipe 25 can be concentric with pre-wetting tank 11.

A water supply pipe 27 is connected to the side wall of the pre-wetting tank below the rim 28 of the overflow pipe. Pipe 27 is connected to a source of a pre-wetting liquid, preferably a commercial water supply system. A valve 29 (later called a second valve) controls the flow of water into the tank. When valve 29 is opened, water flows into the pre-wetting tank and over the rim 28 of the overflow pipe and through the overflow pipe and into drain pipe 12.

The pre-wetting tank holds enough water below the rim of the overflow pipe and water supply pipe 27 enters the tank at a suitable position below rim 28 so that water flows evenly over rim 28 and evenly wets the inside walls of overflow pipe 25 and drain pipe 12.

Overflow pipe 25 and drain pipe 12 function as distinct components but they can be constructed as a single pipe, as represented diagrammatically in FIG. 1. Similarly, the two pipes 12, 25 can be formed separately with a connection at any point along the length represented in FIG. 1.

Preferably, as FIG. 1 shows, a pipe 31 from relief valve 21 extends into pre-wetting tank 11 coaxially with overflow pipe 25 for a sufficient distance to direct the waste from the buffer tank into overflow pipe 25. The rim 28 of the overflow pipe is flared to receive the waste from pipe 31. Small amounts of waste from the buffer tank can spill into space 26 of the pre-wetting tank without harm, but waste material in space 26 will flow into drain pipe 12 on the next pre-wetting cycle and may crystalize on the pipe walls.

Operation

The waste in buffer tank 10 is transferred to waste tank 13 when the buffer tank has been filled to a selected level. (The selected level is explained later.) The water level in the space 26 of the pre-wetting tank is at the rim 28 of the overflow pipe from a previous operation or from an initial operation to fill it to this level.

Valve 29 is opened and water flows into the pre-wetting tank and overflows pipe 25 to pre-wet the inside surface of drain pipe 12. Valve 29 is then closed and relief valve 21 is opened and the waste in the buffer tank flows through pipe 31 and through pipes 25 and 12 into waste tank 13.

Preferably the amount of pre-wetting water is controlled by opening valve 29 for a predetermined time, preferably in the range of 5 to 10 seconds.

Valve 29 can be opened for a trial time interval while the water from the lower end of pipe 12 flows into a suitable sink and the lower end of the pipe can then be inspected for suitably even wetting.

Automating the Process

The preferred system is provided with sensors and controls to execute the process automatically. A high level sensor 33 and a low level sensor 34 are located in buffer tank 11 to signal these levels of the chemical waste in the buffer tank. A sensor 35 in the waste tank 13 signals that the automatic operation is to be discontinued while the full waste tank is replaced with an empty tank. Suitable sensors 33, 34, and 35 are well known and they are shown schematically in the drawing.

When the liquid level rises to the high level, sensor 33 produces a signal on a line 36 to open valve 29 and a signal on a line 37 to open relief valve 21 in the sequence that has been described. When the level falls to the level of sensor 34, sensor 34 produces a signal on a line 38 to close relief valve and a signal on a line 39 to close the water-in valve.

Controls that are associated with the sensors and the signal lines are well known and will be readily understood and are not shown in the drawing.

Other Embodiments

The invention will be useful with other chemicals that crystalize or otherwise form deposits on the apparatus. The preferred embodiment has been described in relation to the preferred size of the components, but the invention can be adapted easily to various sizes.

Those skilled in the art will recognize various modifications within the spirit of the invention and the intended scope of the claims.

We claim:

1. Apparatus for handling a liquid waste, comprising, a waste tank (13) and a drain pipe (12) leading to the waste tank, a buffer tank (10) having an inlet (19) connectable for receiving a liquid waste, an outlet (20), and a first valve (21) for controlling the flow of liquid waste from the outlet of the buffer tank, the buffer tank having a high level selected for emptying the buffer tank and a low level selected for filling the buffer tank, a pre-wetting tank (11) having an inlet (22) and a outlet (23), the inlet being connected to receive the liquid waste from the buffer tank when the first valve is open, the pre-wetting tank further having an overflow pipe (25) connected to the drain pipe and extending inside the pre-wetting tank for a predetermined distance from the lower outlet (23) of the pre-wetting tank and spaced from the inside walls of the pre-wetting tank to form a space (26) inside the pre-wetting tank for holding a pre-wetting liquid, and a line (27) carrying the pre-wetting liquid to the space (26) in the pre-wetting tank and a second valve (29) located for beginning the flow of the pre-wetting liquid to the pre-wetting tank when the second valve is open and stopping the flow of the pre-wetting liquid when the second valve is closed, whereby opening the second valve for a predetermined time causes the pre-wetting liquid to overflow the upper rim of the overflow pipe to wet the inside walls of the drain pipe sufficiently to prevent the liquid waste from crystalizing on the inside walls of the drain pipe, and control means operable when the level of liquid waste in the buffer tank reaches the high level for opening the second valve for admitting said predetermined amount of pre-wetting liquid to the pre-wetting tank and thereafter opening the first valve to transfer liquid waste from the buffer tank to the waste tank and thereafter closing the first valve to begin filling the buffer tank again.

2. The apparatus of claim 1 wherein the pre-wetting liquid is water.

3. The apparatus of claim 2 wherein the buffer tank, the pre-wetting tank and the waste tank are located for transferring the liquid waste by gravity flow.

4. The apparatus of claim 3 wherein the buffer tank has a capacity to produce a sufficient flow when the first valve is open to tend to prevent the liquid waste from crystalizing on the walls of the drain pipe.

5. The apparatus of claim 3 wherein the pre-wetting tank includes a pipe extending from the inlet to direct the flow of waste to the overflow pipe.

6. The apparatus of claim 5 wherein the rim of the overflow pipe is flared to receive the flow of waste from the pipe at the inlet.

7. The apparatus of claim 6 wherein the overflow pipe and the drain pipe are coaxial and have substantially the same diameter.

8. The apparatus of claim 3 including an upper level sensor and a lower level sensor in the buffer tank for signaling the start and end of an operation to pre-wet the drain pipe and to then transfer liquid waste from the buffer tank.

9. The apparatus of claim 3 including control means for opening the first and second valves in sequence in response to the signal from the upper level sensor and for closing the first and second valves in response to the signal from the lower level sensor.

10. A process for handling a liquid chemical waste comprising the following steps, providing a buffer tank for initially receiving the waste, the buffer tank having an outlet and having a first valve for controlling the flow of liquid waste from the outlet of the buffer tank, providing a waste tank for thereafter receiving the liquid waste and a drain pipe for transferring the liquid to the waste tank, providing a pre-wetting tank connected to receive the liquid chemical waste from the buffer tank when the first valve is open, the pre-wetting tank having an overflow pipe leading to the waste tank, providing a connection including a second valve for supplying water to the pre-wetting tank to pre-wet the tank, detecting a high level and a low level of liquid chemical waste in the buffer tank, operating the second valve when the liquid waste reaches the high level in the buffer tank to flow a predetermined amount of water into the pre-wetting tank to overflow the overflow pipe and thereby flow water down the inside walls of the drain pipe to pre-wet the inside walls of the drain pipe, and thereafter operating the first valve for transferring the liquid waste in the buffer tank through the pre-wetted drain pipe to the waste tank.

11. The process of claim 10 wherein the step of flowing a predetermined amount of water down the walls of the drain pipe includes flowing the water until the completion of the step of transferring the waste to the waste tank.

\* \* \* \* \*